United States Patent
Narahara et al.

(10) Patent No.: US 9,631,297 B2
(45) Date of Patent: Apr. 25, 2017

(54) METHOD OF PRODUCING EPITAXIAL SILICON WAFER AND EPITAXIAL SILICON WAFER

(71) Applicant: SUMCO CORPORATION, Tokyo (JP)

(72) Inventors: Kazuhiro Narahara, Nagasaki (JP); Sumihisa Masuda, Saga (JP)

(73) Assignee: SUMCO CORPORATION, Tokyo (JP)

(*) Notice: Subject to any disclaimer, the term of this patent is extended or adjusted under 35 U.S.C. 154(b) by 0 days.

(21) Appl. No.: 14/414,487

(22) PCT Filed: Jul. 24, 2013

(86) PCT No.: PCT/JP2013/004506
§ 371 (c)(1),
(2) Date: Jan. 13, 2015

(87) PCT Pub. No.: WO2014/024404
PCT Pub. Date: Feb. 13, 2014

(65) Prior Publication Data
US 2015/0184314 A1 Jul. 2, 2015

(30) Foreign Application Priority Data

Aug. 9, 2012 (JP) ................................. 2012-177317

(51) Int. Cl.
*C30B 25/12* (2006.01)
*C30B 25/18* (2006.01)
(Continued)

(52) U.S. Cl.
CPC ............ *C30B 25/186* (2013.01); *C30B 25/20* (2013.01); *C30B 29/06* (2013.01);
(Continued)

(58) Field of Classification Search
CPC .......... C30B 29/06; C30B 25/12; C30B 25/18
See application file for complete search history.

(56) References Cited

U.S. PATENT DOCUMENTS

| | | | | |
|---|---|---|---|---|
| 5,751,055 A | * | 5/1998 | Maruyama | ........ H01L 21/02532 117/902 |
| 5,989,985 A | * | 11/1999 | Maruyama | ........ H01L 21/02532 257/E21.119 |

(Continued)

FOREIGN PATENT DOCUMENTS

| | | |
|---|---|---|
| JP | 4-122023 | 4/1992 |
| JP | 2000-269147 | 9/2000 |

(Continued)

OTHER PUBLICATIONS

Office Action issued in China family member Patent Appl. No. 201380040947.9, dated Jun. 3, 2016, along with an English translation thereof.

(Continued)

*Primary Examiner* — Robert M Kunemund
(74) *Attorney, Agent, or Firm* — Greenblum & Bernstein, P.L.C.

(57) ABSTRACT

Provided is a method of producing an epitaxial silicon wafer which has high flatness at the peripheral portion and an epitaxial silicon wafer obtained by the method. In the method of producing an epitaxial silicon wafer, an epitaxial layer is formed on the top surface of a silicon wafer with a chamfered end having a width of 200 μm or less, which surface has a surface orientation of the (100) plane or the (110) plane.

7 Claims, 10 Drawing Sheets

(51) Int. Cl.
*C30B 25/20* (2006.01)
*H01L 21/02* (2006.01)
*C30B 29/06* (2006.01)
*H01L 29/04* (2006.01)
*H01L 29/06* (2006.01)
*H01L 29/16* (2006.01)

(52) U.S. Cl.
CPC .... *H01L 21/02021* (2013.01); *H01L 21/0262* (2013.01); *H01L 21/02381* (2013.01); *H01L 21/02433* (2013.01); *H01L 21/02532* (2013.01); *H01L 21/02576* (2013.01); *H01L 21/02579* (2013.01); *H01L 21/02587* (2013.01); *H01L 21/02609* (2013.01); *H01L 29/045* (2013.01); *H01L 29/0657* (2013.01); *H01L 29/16* (2013.01); *Y10T 428/24488* (2015.01)

(56) References Cited

U.S. PATENT DOCUMENTS 7,998,867 B2 * 8/2011 Takaishi .................. C30B 29/06
257/618
2003/0104222 A1 * 6/2003 Ono ........................ C30B 15/00
428/446
2009/0291621 A1 11/2009 Yamada
2010/0237470 A1 * 9/2010 Takaishi .................. C30B 25/12
257/618
2011/0256815 A1 * 10/2011 Mizushima ............. B24B 9/065
451/177

FOREIGN PATENT DOCUMENTS

| | | |
|---|---|---|
| JP | 2011-249675 | 12/2011 |
| JP | 2012-142485 | 7/2012 |
| TW | 201018755 | 5/2010 |
| WO | 2010/035510 | 4/2010 |

OTHER PUBLICATIONS

Office Action issued in Korean family member Patent Appl. No. 10-2015-7002970, dated Feb. 1, 2016, along with an English-language translation thereof.

Taiwan Office action, dated Dec. 5, 2014 along with an english translation thereof.

Search report from International Patent Appl. No. PCT/JP2013/004506, mail date is Oct. 22, 2013.

* cited by examiner

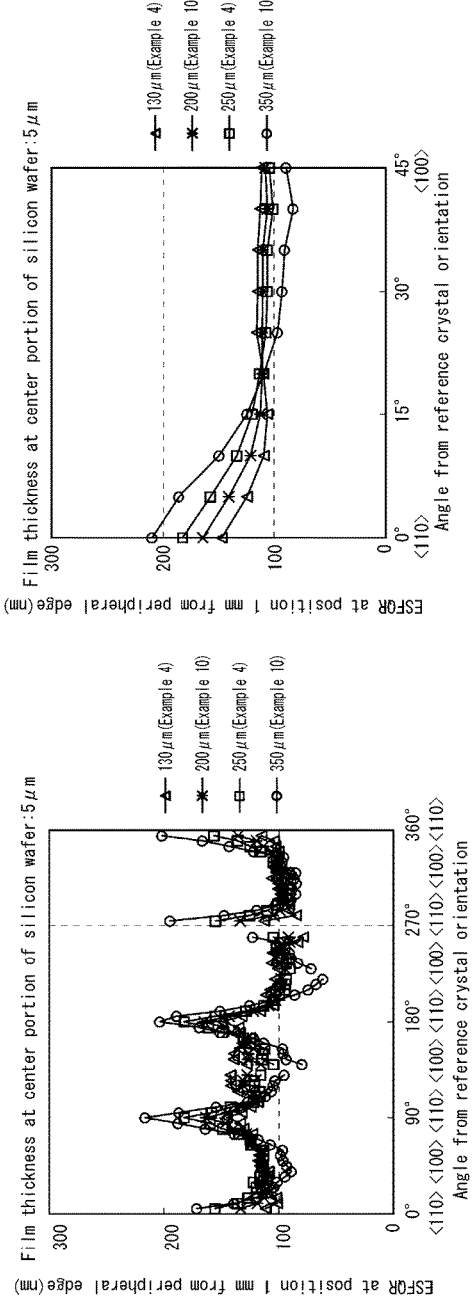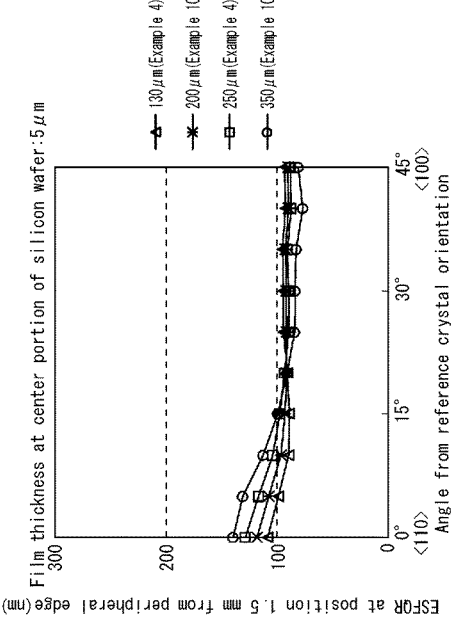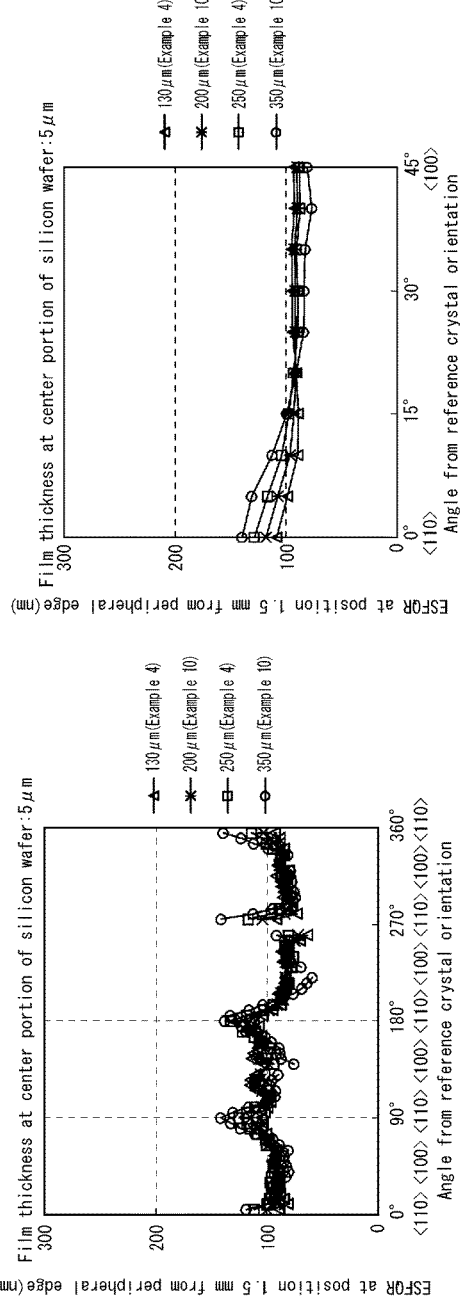

METHOD OF PRODUCING EPITAXIAL SILICON WAFER AND EPITAXIAL SILICON WAFER

TECHNICAL FIELD

The present invention relates to a method of producing an epitaxial silicon wafer in which an epitaxial layer is formed on one surface of a silicon wafer and to an epitaxial wafer obtained by the method.

BACKGROUND ART

An epitaxial silicon wafer is a wafer obtained by spraying a silicon source gas on a silicon wafer serving as a substrate to grow an epitaxial layer, and is used for a wide variety of uses such as memory elements, logic elements, and image sensors.

In order to improve the integration degree of those semiconductor elements, the flatness of epitaxial silicon wafers is one of the important factors; accordingly, there is a great need for highly flat epitaxial silicon wafers. Further, in order to make more semiconductor elements from one epitaxial silicon wafer, the whole surface, especially including the edge portions of a wafer (wafer end) is required to be flat in shape. The edge exclusion zone for measurement of the flatness of a wafer surface has conventionally been 3 mm from the wafer edge, it is now progressively reduced to 2 mm, and is even further challenged to 1 mm.

Here, with reference to FIGS. 10(A) and 10(B), the film thickness profile of an epitaxial layer grown on the (100) plane of a silicon wafer will be described.

The <110> direction shown in FIG. 10(B) is a reference crystal orientation. The <110> direction in FIG. 10(B) corresponds to 0° (360°), 90°, 180°, and 270° in FIG. 10(A), whereas the <100> direction in FIG. 10(B) corresponds to 45°, 135°, 225°, and 315° in FIG. 10(A). FIG. 10(A) shows the respective film thickness profiles in the circumferential direction of the epitaxial layer measured at 1 mm, 2 mm, and 3 mm inside the peripheral edge of the epitaxial wafer.

As seen from FIG. 10(A), the epitaxial layer is thinner at the peripheral portion of the <100> direction (peripheral region of the epitaxial surface extending approximately 1 mm to 3 mm from the peripheral edge of the epitaxial wafer), whereas the epitaxial layer is thicker at the peripheral portion of the <110> direction. In other words, there is periodic variation in the film thickness in the circumferential direction of the epitaxial layer at the peripheral portion. This is because the growth rate of the epitaxial layer is lower at the peripheral portion of the <100> direction, whereas the rate is higher at the peripheral portion of the <110> direction. Such a character that the growth rate of an epitaxial layer at the peripheral portion of an epitaxial silicon wafer depends on the crystal orientation of a silicon wafer serving as a base is referred to as the orientation dependence of growth rate. Such growth rate orientation dependence causes a reduced flatness of the peripheral portion of an epitaxial silicon wafer. Further, the difference between the maximum value and the minimum value of the thickness in the circumferential direction of the epitaxial layer is larger in areas closer to the peripheral edge of the epitaxial silicon wafer, as demonstrated in FIG. 10(A). This is attributed to the growth rate orientation dependence being stronger in areas closer to the peripheral edge of the epitaxial layer.

As described above, the growth rate of the epitaxial layer greatly varies periodically in the circumferential direction of the epitaxial layer in areas of the peripheral portion of the epitaxial silicon wafer closer to the peripheral edge, depending on the crystal orientation. Therefore, it is known to be difficult to increase the flatness of the peripheral portion, especially the areas closer to the peripheral edge where the film thickness greatly varies periodically. This phenomenon occurs also in the case of growing an epitaxial layer on the (110) plane of the silicon wafer.

To this date, there are known methods for planarizing the surface of an epitaxial layer, such as a method of increasing the flatness by mirror polishing the surface of an epitaxial layer after forming the epitaxial layer (PTL 1: JP H04-122023 A) or a method of controlling the flow of the source gas supplied for growing an epitaxial layer, in the diameter direction (PTL 2: JP 2000-269147 A).

CITATION LIST

Patent Literature

PTL 1: JP H04-122023 A
PTL 2: JP 2000-269147 A

SUMMARY OF INVENTION

Technical Problem

However, the method described in PTL 1 needs to add a step to mirror polish the surface of the epitaxial layer, which leads to increased production cost and would even cause process damage to the epitaxial layer due to the polishing process. Further, since the mirror polishing on the surface of the epitaxial layer is basically performed to uniformly polish the plane to the same level, the growth rate orientation dependence in the circumferential direction can hardly be suppressed. The method described in PTL 2 can control the film thickness profile in the diameter direction of the epitaxial layer but cannot control the film thickness profile in the circumferential direction, and cannot improve the deterioration in the flatness of the peripheral portion due to the growth rate orientation dependence.

In view of the above problems, it is an object of the present invention to provide a method of producing an epitaxial silicon wafer which has high flatness at the peripheral portion and an epitaxial silicon wafer obtained by the method.

Solution to Problem

The inventors of the present invention made intensive studies to achieve the above-described object to find the following.

When the crystal plane to be grown epitaxially is the (100) plane or the (110) plane, the above-mentioned growth rate orientation dependence can develop; however, they found that the growth rate orientation dependence can be suppressed by reducing the width of chamfer on the end of the surface to be grown, to 200 μm or less that is smaller than the conventionally used range. When an epitaxial layer is formed on such a silicon wafer, the growth rate orientation dependence can be suppressed, so that an epitaxial silicon wafer having high flatness at the peripheral portion can be obtained. Based on such findings, the inventors have accomplished the present invention.

The present invention primarily includes following features.

In a method of producing an epitaxial silicon wafer according to the present invention, an epitaxial layer is formed on one surface of a silicon wafer with a chamfered end having a width of 200 µm or less, which surface has a surface orientation of the (100) plane or the (110) plane.

Further, in the method of producing an epitaxial silicon wafer according to the present invention, the film thickness of the epitaxial layer at a center portion of the silicon wafer is preferably 2 µm to 10 µm.

Furthermore, in the method of producing an epitaxial silicon wafer according to the present invention, the width of chamfer on the one surface side of the silicon wafer is preferably 100 µm or more.

Yet further, in the method of producing an epitaxial silicon wafer according to the present invention, the width of chamfer on the other surface side of the silicon wafer is preferably 300 µm to 400 µm.

Moreover, in the method of producing an epitaxial silicon wafer according to the present invention, the PV value with respect to a surface of the epitaxial layer is preferably controlled to 12.5 or less, the PV value being defined as a value found by dividing a value (nm) obtained by subtracting the minimum value of the average value of the ESFQR per crystal orientation with the edge exclusion zone being set to 1 mm from the maximum value thereof, by the film thickness (µm) of the epitaxial layer at the center portion of the silicon wafer.

An epitaxial silicon wafer according to the present invention comprises:

a silicon wafer of which one surface has a surface orientation of the (100) plane or the (110) plane and has a chamfered end having a width of 200 µm or less; and an epitaxial layer formed on the one surface of the silicon wafer.

The PV value with respect to a surface of the epitaxial layer is 12.5 or less, the PV value being defined as a value found by dividing a value (nm) obtained by subtracting the minimum value of the average value of the ESFQR per crystal orientation with the edge exclusion zone being set to 1 mm from the maximum value thereof, by the film thickness (µm) of the epitaxial layer at a center portion of the silicon wafer.

Further, in the epitaxial silicon wafer according to the present invention, the film thickness of the epitaxial layer at a center portion of the silicon wafer is preferably 2 µm to 10 µm.

Furthermore, in the epitaxial silicon wafer according to the present invention, the width of chamfer on the other surface side of the silicon wafer is preferably 300 µm to 400 µm.

Advantageous Effects of Invention

The present invention can provide a method of producing an epitaxial silicon wafer having high flatness at the peripheral portion by suppressing the growth rate orientation dependence due to reducing the width of chamfer on the end of the surface of a silicon wafer to be epitaxially grown, to 200 µm or less and then forming an epitaxial layer and can provide an epitaxial silicon wafer which can be obtained by the method.

BRIEF DESCRIPTION OF DRAWINGS

FIG. 1(A) is a cross-sectional view taken along the <100> direction, whereas FIG. 1(B) is a cross-sectional view taken along the <110> direction.

FIG. 3(A) is a top view of the epitaxial silicon wafer, whereas FIG. 3(B) is a cross-sectional view taken along line I-I in FIG. 3(A).

FIG. 4(B) is a graph in which FIG. 4(A) is periodized by 45°.

FIG. 5(B) is a graph in which FIG. 5(A) is periodized by 45°.

FIG. 8(A) is a graph showing the film thickness at a position 1 mm from the peripheral edge. FIG. 8(B) is a graph showing the film thickness at a position 2 mm from the peripheral edge. FIG. 8(C) is a graph in which FIG. 8(A) is periodized by 45° and the relative value of the film thickness at 0° is used. FIG. 8(D) is a graph in which FIG. 8(B) is periodized by 45° and the relative value is used as with FIG. 8(C).

FIGS. 9(A) to 9(D) are graphs showing the relationship between the angle from the reference crystal orientation and the ESFQR of the surface of the epitaxial wafer in Examples 4 and 10 and Comparative Examples 4 and 10. FIG. 9(A) is a graph showing the ESFQR at a position 1 mm from the peripheral edge. FIG. 9(B) is a graph showing the ESFQR at a position 1.5 mm from the peripheral edge. FIG. 9(C) is a graph in which FIG. 9(A) is periodized by 45°. FIG. 9(D) is a graph in which FIG. 9(B) is periodized by 45°.

FIG. 10(A) is a graph showing the relationship between the angle from the reference crystal orientation and the film thickness of an epitaxial layer in Comparative Example 7, whereas FIG. 10(B) is a top view showing the crystal orientation of the silicon wafer to be a substrate.

DESCRIPTION OF EMBODIMENTS

Figure 10A:
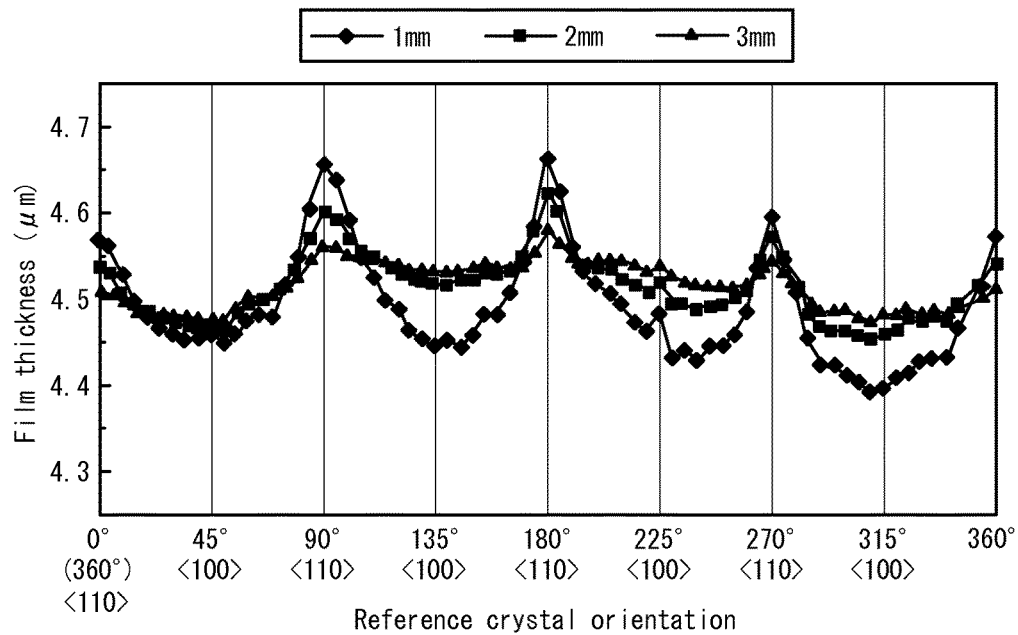
FIGS. 10(A) and 10(B) are diagrams illustrating the growth rate orientation dependence of a conventionally known epitaxial layer.
Figure 10B:
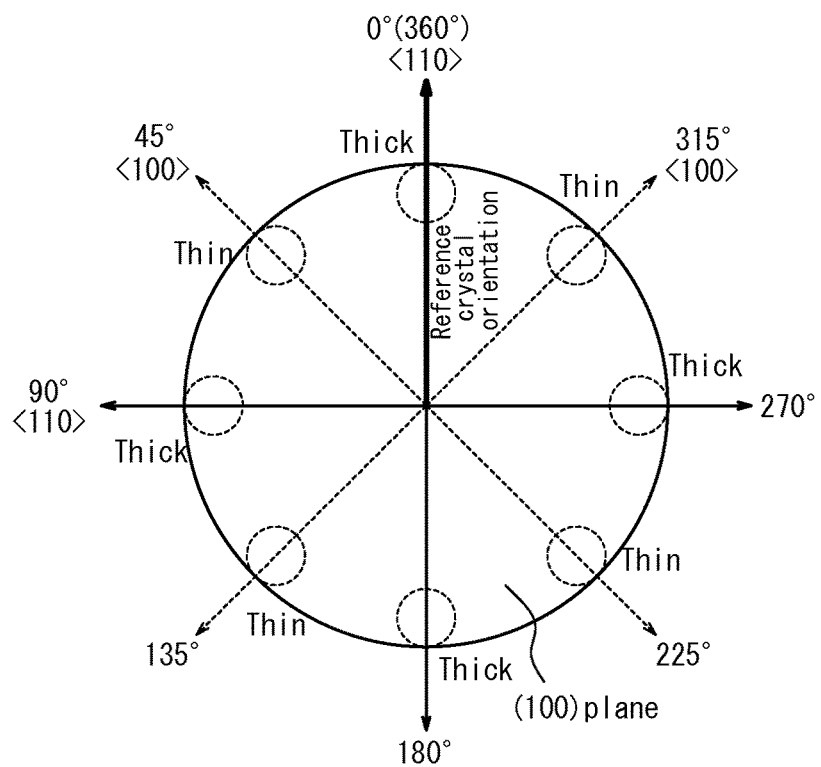

An epitaxial silicon wafer 1 in accordance with one embodiment of the present invention and a method of producing the same are described below with reference to FIGS. 1(A) to 9(D). Note that the crystal orientation to be used as a reference is the same as the <110> direction described above with reference to FIGS. 10(A) and 10(B).

A method of producing the epitaxial silicon wafer 1 in accordance with one embodiment of the present invention will now be described with reference to FIG. 1(A). First, a silicon wafer 2 to be a substrate is fabricated. In a bevel region 22 of the silicon wafer 2, the width of chamfer on the end of the top surface 23 side is A1, and the width of chamfer on the end of the back surface 24 side is A2. In this embodiment, chamfering is performed such that A1 of the silicon wafer 2 is 200 μm or less. Meanwhile, in this embodiment, the crystal plane of the top surface 23 of the silicon wafer 2 is the (100) plane. As can be seen from the above, a surface of the silicon wafer where an epitaxial layer is grown is herein referred to as "top surface" and the opposite surface is herein referred to as "rear surface" of the silicon wafer.

Here, the width of chamfer on the top and rear surfaces of the silicon wafer 2 can be controlled by any given method. For example, the edge face of a silicon wafer sliced out of a silicon ingot may be chamfered using a grindstone coated with diamond or the like.

Next, an epitaxial layer 3 is formed on the top surface 23 that is one of the surfaces of the silicon wafer 2 to obtain the epitaxial silicon wafer 1. The epitaxial growth conditions for forming the epitaxial layer 3 on the top surface 23 of the silicon wafer 2 are not limited in particular. For example, the silicon wafer is transversely set in a susceptor so that the top and rear surfaces of the wafer are horizontal. Next, in order to remove natural oxide films or particles on the surfaces of the silicon wafer, hydrogen gas is supplied into a chamber to perform hydrogen bake at a temperature of approximately 1150° C. for about 60 seconds. After that, a carrier gas ($H_2$ gas), a silicon source gas (such as silicon tetrachloride, monosilane ($SiH_4$), trichlorosilane ($SiHCl_3$), or dichlorosilane ($SiH_2Cl_2$)), and a dopant gas (such as diborane ($B_2H_6$) or phosphine ($PH_3$)) are supplied into the chamber thereby performing epitaxial growth at a growth rate of 1 μm/min to 3 μm/min on the surface of the silicon wafer heated at a chamber temperature of 1000° C. to 1150° C.

Figure 1A:
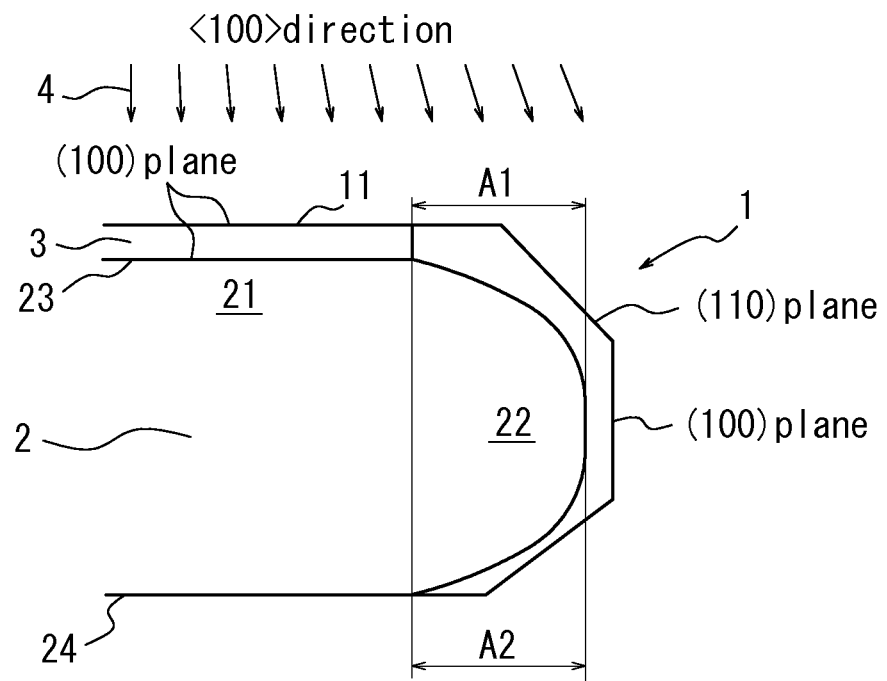
FIGS. 1(A) and 1(B) are schematic views each showing an epitaxial silicon wafer in which an epitaxial layer is formed on the (100) plane of a silicon wafer in accordance with one embodiment of the present invention.
Figure 1B:
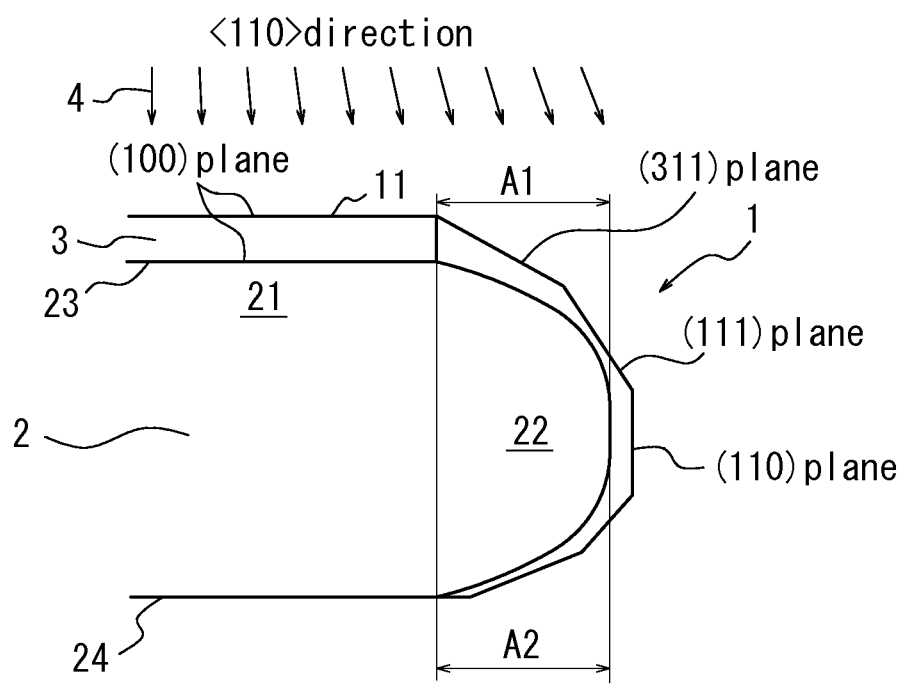

Here, with reference to FIGS. 1(A) and 1(B), the reason for that when the epitaxial layer 3 is grown on the top surface 23 of the silicon wafer 2, the growth rate of the peripheral portion 11 of the epitaxial layer 3 depends on the crystal orientation of the silicon wafer 2 is described.

The inventors focused on that the growth rate orientation dependence of the aforementioned epitaxial layer is due to the epitaxial growth rate that varies depending on the crystal orientation at the bevel region 22. Specifically, the epitaxial growth rate of the bevel region 22 of the <100> direction is higher than the epitaxial growth rate in the bevel region 22 of the <110> direction. This is attributed to the following phenomenon. As shown in FIG. 1(A), the epitaxial layer 3 formed on the chamfered portion of the bevel region 22 of the <100> direction has the (110) plane where the growth rate is high. Thus promoted epitaxial growth in the area inhibits the growth of the epitaxial layer 3 on an edge region 21 of the top surface 23. On the other hand, as shown in FIG. 1(B), the epitaxial layer 3 formed on the chamfered portion of the bevel region 22 of the <110> direction has the (311) plane and the (111) plane where the growth rate is low. Accordingly, the epitaxial growth in this area is suppressed, which leads to the promotion of the growth of the epitaxial layer 3 on the edge region 21 of the top surface 23. As a result, the film thickness of the epitaxial layer 3 on the edge region 21 of the top surface 23 is presumably small in the case of the <100> direction and large in the case of the <110> direction.

Figure 2A:
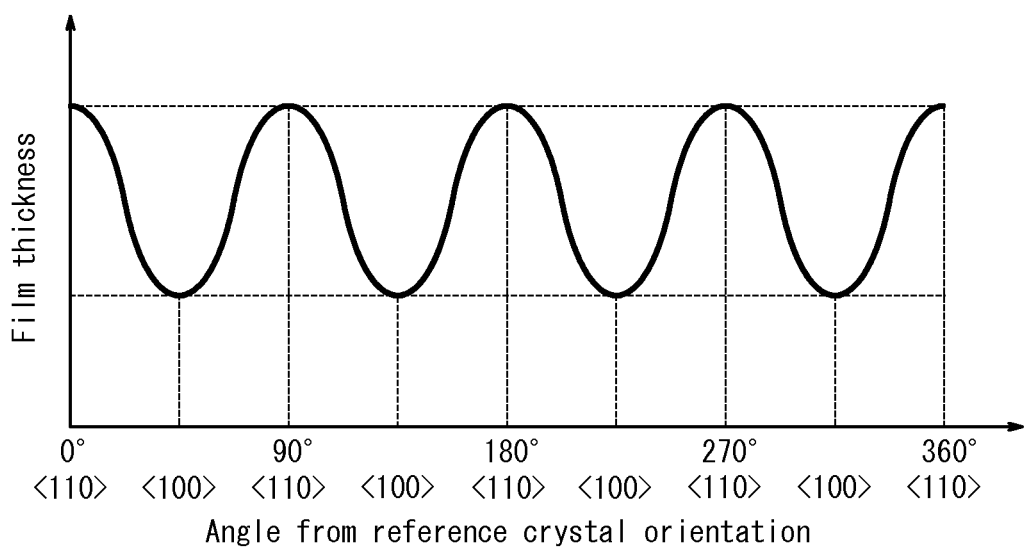
FIG. 2(A) is a diagram showing the relationship between the angle from the reference crystal orientation of an epitaxial silicon wafer in accordance with one embodiment of the present invention and the film thickness of the epitaxial layer.

Thus, as shown in FIG. 2(A), the film thickness of the peripheral portion 11 of the epitaxial layer 3 periodically varies in the circumferential direction depending on the crystal orientation. An objective of the present invention is to minimize the periodic variation.

Here, the inventors found that reduction in the width of chamfer A1 on the bevel region 22 of the top surface 23 side results in the reduction of the region of the epitaxial layer 3 on the bevel region 22 and the suppression of the growth rate orientation dependence of the aforementioned epitaxial layer. Accordingly, by making the width A1 of chamfer on the end of the top surface 23 side 200 μm or less and forming the epitaxial layer 3 on the top surface 23 side of the silicon wafer 2 having a smaller width of chamfer than conventional, the growth rate orientation dependence can be suppressed and the epitaxial silicon wafer 1 having high flatness even at the peripheral portion 11 can be obtained. On the other hand, A1 exceeding 200 μm lowers the effect of suppressing the growth rate orientation dependence.

The crystal plane of the top surface 23 of the silicon wafer 2 is the (100) plane in the above embodiment; alternatively, it may be the (110) plane. Only one difference between them is that in the case of the (100) plane, the growth rate orientation dependence of the film thickness of the epitaxial layer 3 has a period of 90°, whereas in the case of the (110) plane, the growth rate orientation difference has a period of 180°. When the A1 is 200 μm or less, the growth rate orientation dependence can be suppressed and the same effect can be obtained.

Next, a method of evaluating the flatness of the peripheral portion 11 of the epitaxial silicon wafer 1 obtained by growing the epitaxial layer 3 on the silicon wafer 2 having an A1 of 200 μm or less is described.

Figure 2B:
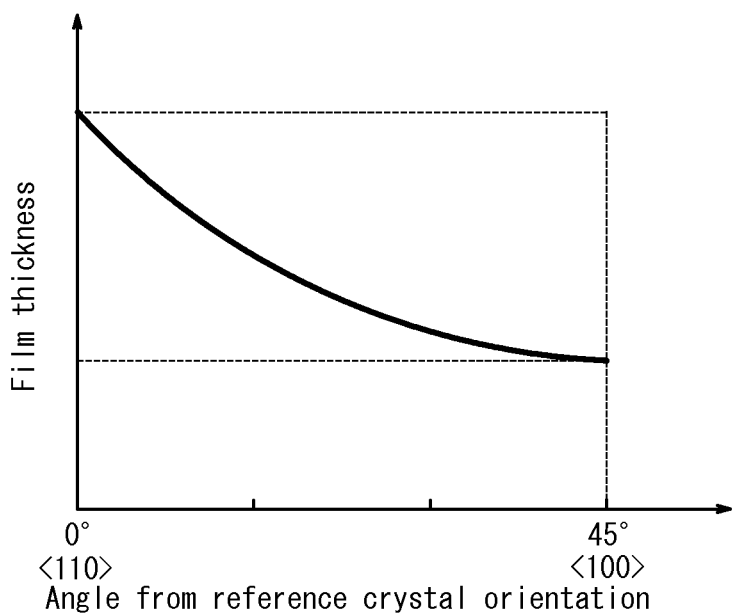
FIG. 2(B) is a diagram in which FIG. (A) is periodized by 45°.
Figure 3A:
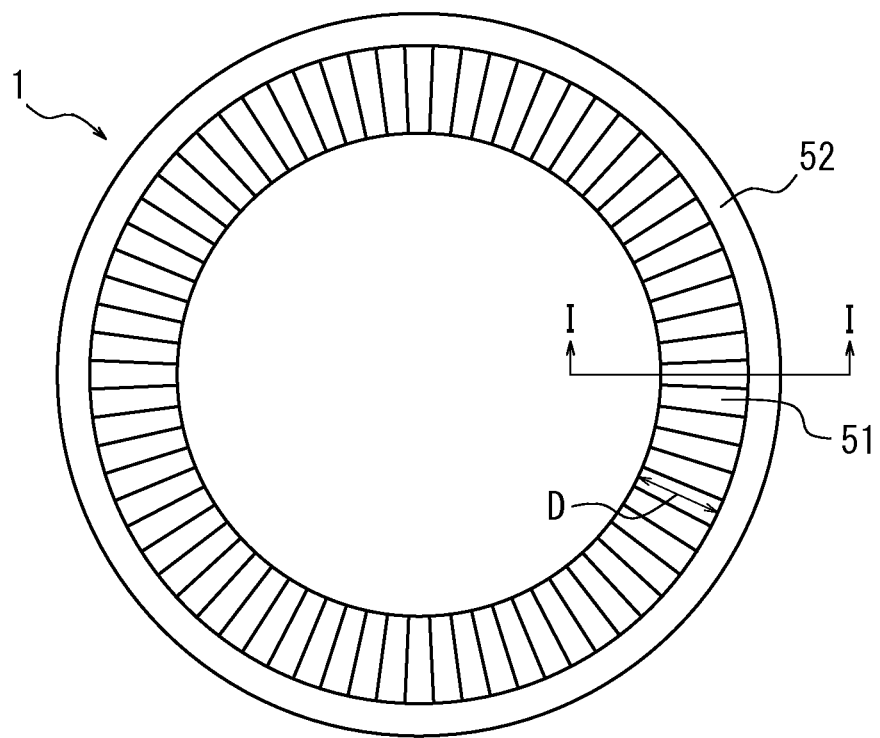
FIGS. 3(A) and 3(B) are diagrams illustrating the ESFQR of the surface of an epitaxial silicon wafer in accordance with one embodiment of the present invention.
Figure 3B:
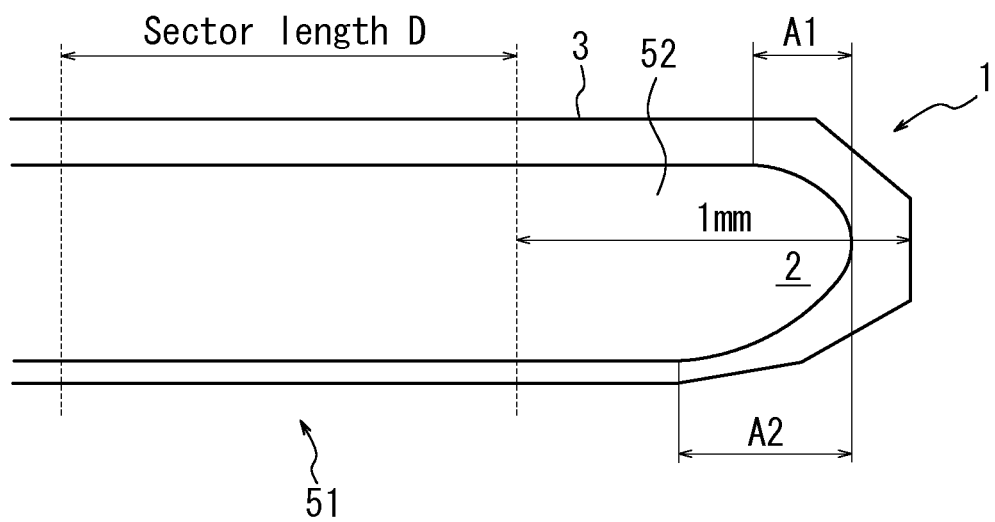

FIG. 2(A) illustrates an example of the theoretical periodicity in the circumferential direction, in which the film thickness of the peripheral portion 11 of either the <110> direction or the <100> direction of the epitaxial layer 3 has the same value at all four positions. However, in actuality, the thickness varies even with the same crystal orientation for such a reason that the silicon wafer 2 cannot be placed exactly at the center of the susceptor. In spite of such variation, the film thickness can be accurately evaluated for each crystal orientation from the average value at a period of 45°. The average at a period of 45° means the average of the film thickness obtained by summing the thicknesses of the total eight sections including four sections of 0° to 45°, 90° to 135°, 180° to 225°, and 270° to 315° and the thicknesses of the four respective inverted sections of 45° to 90°, 135° to 180°, 225° to 270°, and 315° to 360° in FIG. 2(A) (hereinafter referred to as "45° periodization"). Thus, even if there is variation in the film thickness of the same crystal orientation, the effect of the variation can be minimized (FIG. 2(B)). Although the film thickness of the peripheral portion of the epitaxial layer is represented by the vertical axis in FIGS. 2(A) and 2(B), the ESFQR also has the similar periodicity and can also be periodized by 45°. Note that as shown in FIG. 2(B), theoretically, the thickness takes its maximum value at 0° corresponding to the <110> direction, and takes the minimum value with orientations excluding the <110> direction (for example, the <100> direction).

The ESFQR (Edge flatness metric, Sector based, Front surface referenced, Site Front least sQuareRange) here means an index representing the flatness found by measuring the SFQR inside a fan-shaped region (sector 51 in FIG. 3) formed in the peripheral portion 11. A smaller ESFQR indicates higher flatness. The ESFQR herein refers to a value found using a flatness measurement system (Wafer Sight manufactured by KLA-Tencor Corporation) with the measurement exclusion region (edge exclusion zone 52) being set to 1 mm for the inside of the sector having a sector length D of 30 mm, obtained by dividing the entire perimeter by 72 at 5-degree intervals. Meanwhile, the SFQR (Site Front least sQuaresRange) is an index for representing the flatness inside a given site in accordance with the SEMI standard. The SFQR refers to a value for evaluating of each of the predetermined sites, which is represented as the sum of the absolute values of maximum displacement amounts of both the positive side and the negative side from a reference plane found by the calculation using a least square method with respect to the site (FIGS. 3(A) and 3(B)).

The PV (Peak to Valley) value is defined using the ESFQR described above. In the present invention, the PV value is defined by dividing a value (nm) obtained by subtracting the minimum value of the average value of the ESFQR per crystal orientation with the edge exclusion zone 52 being set to 1 mm from the maximum value thereof, by the film thickness (μm) of the epitaxial layer at the center portion of the silicon wafer. This is the same value as the value obtained by dividing the difference (nm) between the maximum value and the minimum value of the ESFQR shown in FIG. 2(B) by the film thickness (μm) of the epitaxial layer. In other words, the PV value is an index for representing the flatness of the peripheral portion 11 of the epitaxial silicon wafer 1 taking into account the film thickness of the epitaxial layer 3 to be grown. A lower PV value means a higher flatness of the peripheral portion 11, that is, less variation in the thickness.

According to this embodiment, the width A1 of chamfer on the top surface 23 side of the silicon wafer 2 is 200 μm or less, so that the growth rate orientation dependence can be suppressed, and as a result, the epitaxial silicon wafer 1 having high flatness at the peripheral portion with a PV value of 12.5 or less can be obtained. This is not because the position where the growth rate orientation dependence appears is shifted to the wafer perimeter side but because the growth rate orientation dependence itself decreases, which is evident from the fact that the variation range in the ESFQR in the circumferential direction decreases in both cases where the position is 1 mm from the peripheral edge of the wafer and where it is 1.5 mm therefrom.

In the present invention, a smaller width A1 of chamfer on the top surface 23 side of the silicon wafer 2 is preferable in terms of suppressing the growth rate orientation dependence; however, in order to reduce the formation of cracks, chips, and the like in the epitaxial wafer 1 in handling or transporting it, the width A1 of chamfer on the top surface 23 side of the silicon wafer 2 is preferably 100 μm or more.

Further, the width A2 of chamfer on the rear surface 24 side of the silicon wafer 2 is preferably 300 μm to 400 μm. Since the width A2 does not have any effect on the growth rate orientation dependence while the epitaxial layer 3 is grown, a width A2 larger than the chamfer width A1 can reduce the formation of cracks and chips in transporting the epitaxial silicon wafer 1. Further, the width A2 of chamfer on the rear surface is desired to be 300 μm to 400 μm also in terms of heat treatment for growing the epitaxial layer 3 or for the device fabrication using the epitaxial wafer 1.

In addition, in the present invention, the film thickness of the epitaxial layer 4 at the center portion of the silicon wafer 2 is preferably 2 μm to 10 μm. The present invention is especially effective when the film thickness of the epitaxial layer 4 is 2 μm or more, since the flatness of the peripheral portion is significantly degraded due to the growth rate orientation dependence in the case where the width A1 of chamfer is larger. On the other hand, when the film thickness exceeds 10 μm, the present invention is effective in terms of suppressing the growth rate orientation dependence at the peripheral portion; however, a crown (an elevated portion of the epitaxial layer at the peripheral portion) would be formed due to other factors.

(Epitaxial Wafer)

The epitaxial wafer 1 obtained by the production method described above has the silicon wafer 2 to be a substrate and the epitaxial layer 3 formed on the top surface 23 which is one of the surfaces of the silicon wafer 2. Here, the crystal plane of the top surface 23 of the silicon wafer 2 is the (100) plane or the (100) plane and the width A1 of chamfer on the top surface 23 side is 200 μm or less. The above described PV value, which is an index of the flatness of the peripheral portion 11 of the epitaxial silicon wafer 1, is 12.5 or less.

Further, the thickness of the epitaxial layer 3 of the epitaxial wafer 1 according to the present invention is preferably 2 μm to 10 μm.

Furthermore, the width A2 of chamfer on the rear surface 24 side of the epitaxial wafer 1 according to the present invention is preferably 300 μm to 400 μm.

EXAMPLES

Next, to clarify the effects of the present invention, Examples and Comparative Examples are given below. However, the present invention is not limited to the following examples.

Example 1

A p-type silicon wafer having a diameter of 300 mm and a thickness of 775 μm, which had been subjected to chamfering on the end of the top surface side to a chamfer width A1 of 130 μm was fabricated. The crystal plane of the top surface of the silicon wafer was the (100) plane, and the width A2 of chamfer on the rear surface was 350 μm.

First, this silicon wafer was set on a susceptor in a single wafer epitaxial growth apparatus; a hydrogen gas was supplied into the chamber; and hydrogen bake was performed at a temperature of 1130° C. for 30 seconds. A silicon source gas (trichlorosilane) and a dopant gas (diborane) were then supplied into the chamber with the hydrogen gas which is a carrier gas to perform epitaxial growth at a temperature of 1130° C. at a growth rate of 2.2 μm/min to form an epitaxial layer having a film thickness of 2 μm at the center portion of the silicon wafer, on the top surface of the silicon wafer. Thus, an epitaxial silicon wafer was obtained.

The fabricated epitaxial silicon wafer was subjected to a measurement of the ESFQR on the top surface using Wafer Sight manufactured by KLA-Tencor Corporation. On that occasion, the edge exclusion zone was set to 1 mm and the sector length was set to 30 mm and the number of sectors was set to 72.

Examples 2 to 12 and Comparative Examples 1 to 12

Epitaxial silicon wafers were fabricated by the same method as Example 1 except that the width A1 of chamfer on the top surface side and/or the film thickness of the epitaxial layer were changed to the values shown in Table 1.

Table 1 shows the PV values and the maximum values of ESFQR of each epitaxial silicon wafer in Examples 1 to 12 and Comparative Examples 1 to 12.

TABLE 1

| | Chamfer width A1 (μm) | Thickness of epitaxial layer (μm) | PV value (nm/μm) | Maximum SFQR (nm) |
|---|---|---|---|---|
| Example 1 | 130 | 2 | 7.1 | 55.5 |
| Example 2 | 130 | 3 | 7.9 | 84.1 |
| Example 3 | 130 | 4 | 8.1 | 116.5 |
| Example 4 | 130 | 5 | 8.2 | 148.9 |
| Example 5 | 130 | 8 | 8.2 | 246.3 |
| Example 6 | 130 | 10 | 8.3 | 311.3 |
| Example 7 | 200 | 2 | 9.7 | 59.3 |
| Example 8 | 200 | 3 | 10.9 | 93.7 |
| Example 9 | 200 | 4 | 11.3 | 129.2 |
| Example 10 | 200 | 5 | 11.6 | 164.9 |
| Example 11 | 200 | 8 | 11.7 | 272.0 |
| Example 12 | 200 | 10 | 11.7 | 343.4 |
| Comparative Example 1 | 250 | 2 | 13.8 | 66.7 |
| Comparative Example 2 | 250 | 3 | 15.4 | 105.1 |
| Comparative Example 3 | 250 | 4 | 15.9 | 143.5 |
| Comparative Example 4 | 250 | 5 | 16.2 | 182.0 |
| Comparative Example 5 | 250 | 8 | 16.4 | 299.5 |
| Comparative Example 6 | 250 | 10 | 16.4 | 377.9 |
| Comparative Example 7 | 350 | 2 | 21.8 | 80.3 |
| Comparative Example 8 | 350 | 3 | 24.2 | 125.7 |
| Comparative Example 9 | 350 | 4 | 25.1 | 171.1 |
| Comparative Example 10 | 350 | 5 | 25.5 | 216.5 |
| Comparative Example 11 | 350 | 8 | 25.8 | 352.9 |
| Comparative Example 12 | 350 | 10 | 26.0 | 444.1 |

Figure 4A:
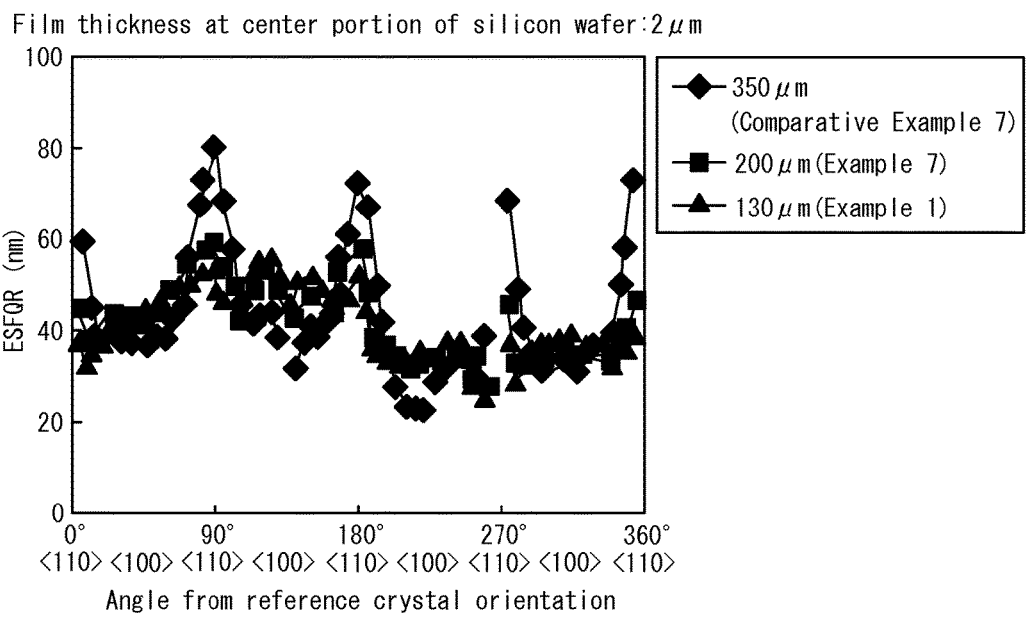
FIG. 4(A) is a graph showing the relationship between the angle from the reference crystal orientation and the ESFQR in Examples 1 and 7 and Comparative Example 7.

FIG. 4(A) shows the results of measurement of ESFQR in Examples 1 and 7 and Comparative Example 7.

Figure 4B:
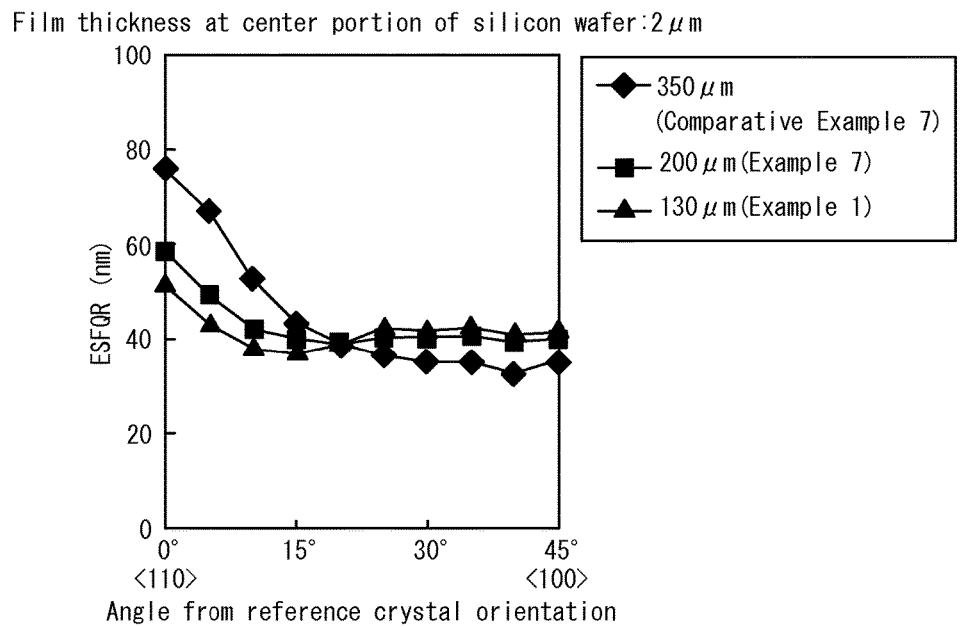

FIG. 4(B) is a graph in which FIG. 4(A) is periodized by 45°.

Figure 5A:
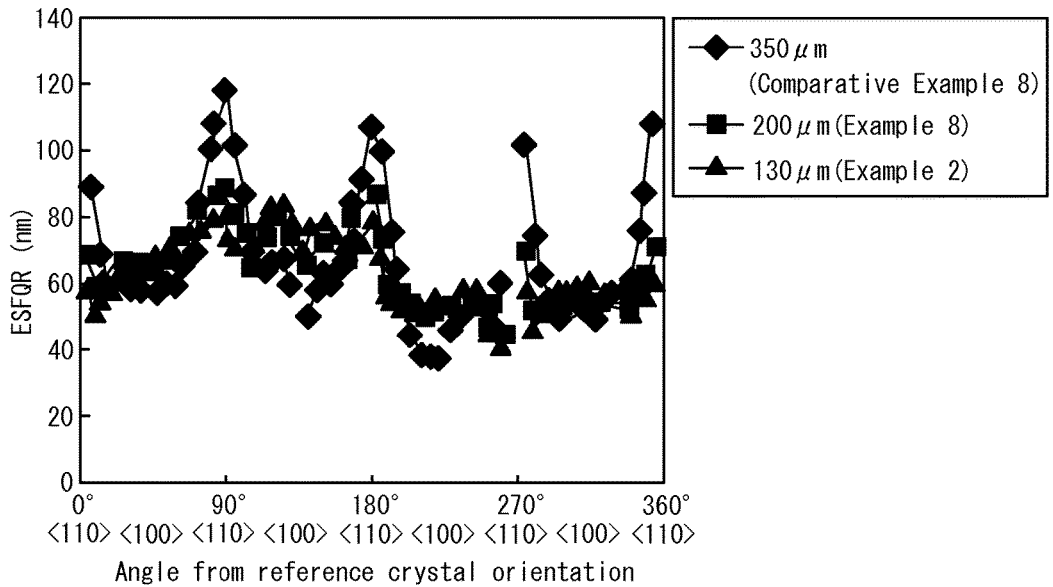
FIG. 5(A) is a graph showing the relationship between the angle from the reference crystal orientation and the ESFQR in Examples 2 and 8 and Comparative Example 8.

FIG. 5(A) shows the results of measurement of ESFQR in Examples 2 and 8 and Comparative Example 8.

Figure 5B:
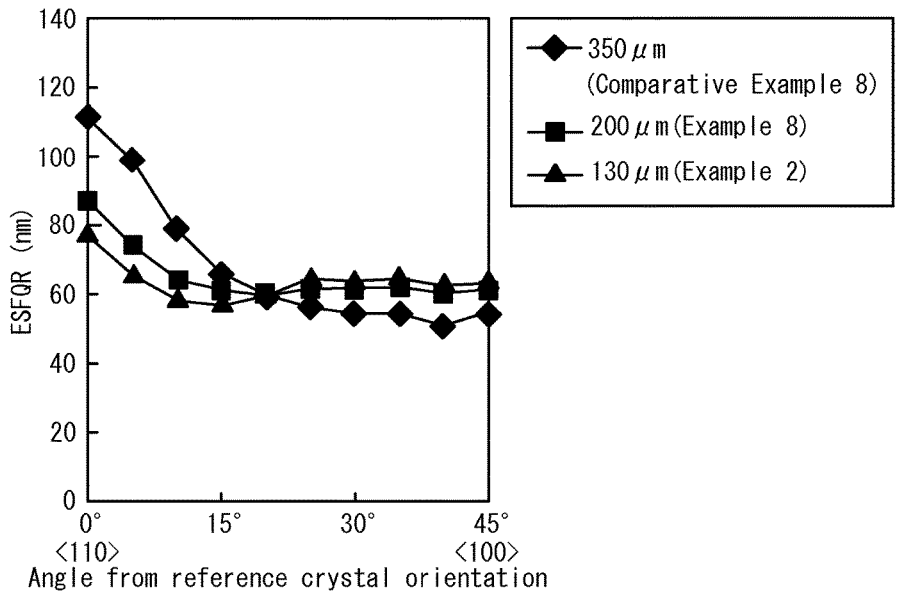

FIG. 5(B) is a graph in which FIG. 5(A) is periodized by 45°.

Figure 6:
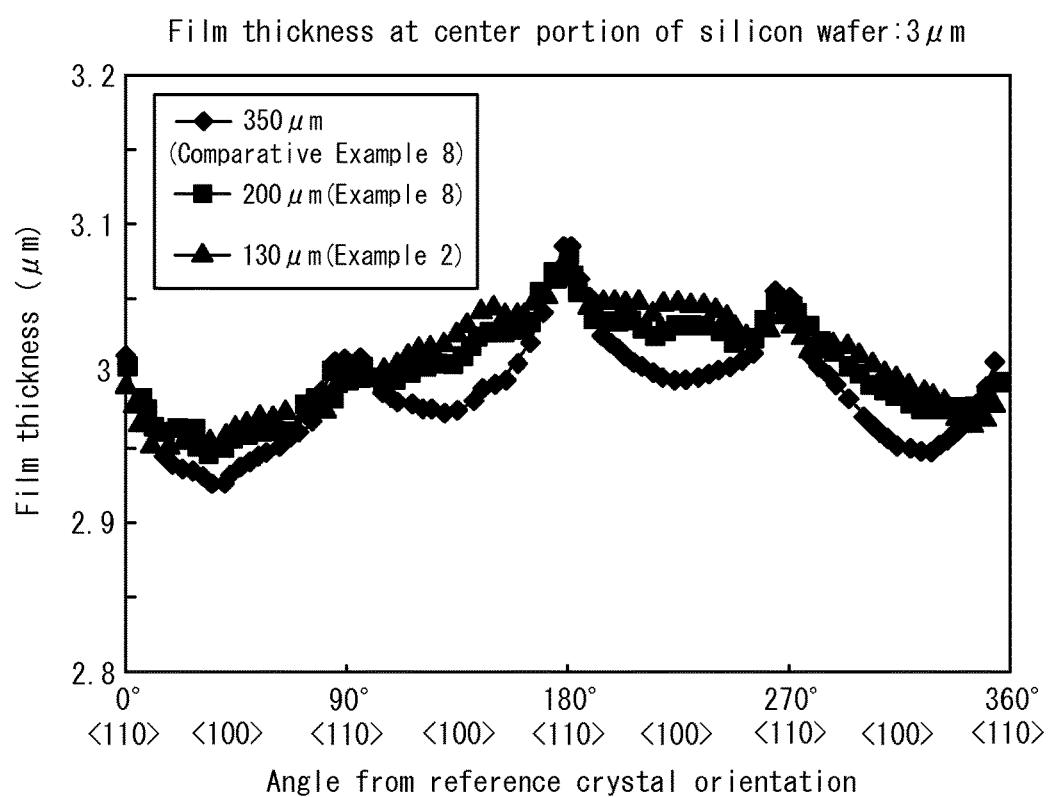
FIG. 6 is a graph showing the relationship between the angle from the reference crystal orientation and the film thickness of epitaxial layers in Examples 2 and 8 and Comparative Example 8.

FIG. 6 is a graph showing the profile of the thickness in the circumferential direction of the epitaxial layer at the peripheral portion (the position 1 mm inside the peripheral edge of the epitaxial wafer) of the epitaxial wafer in Example 2 and 8 and Comparative Example 8.

Figure 7:
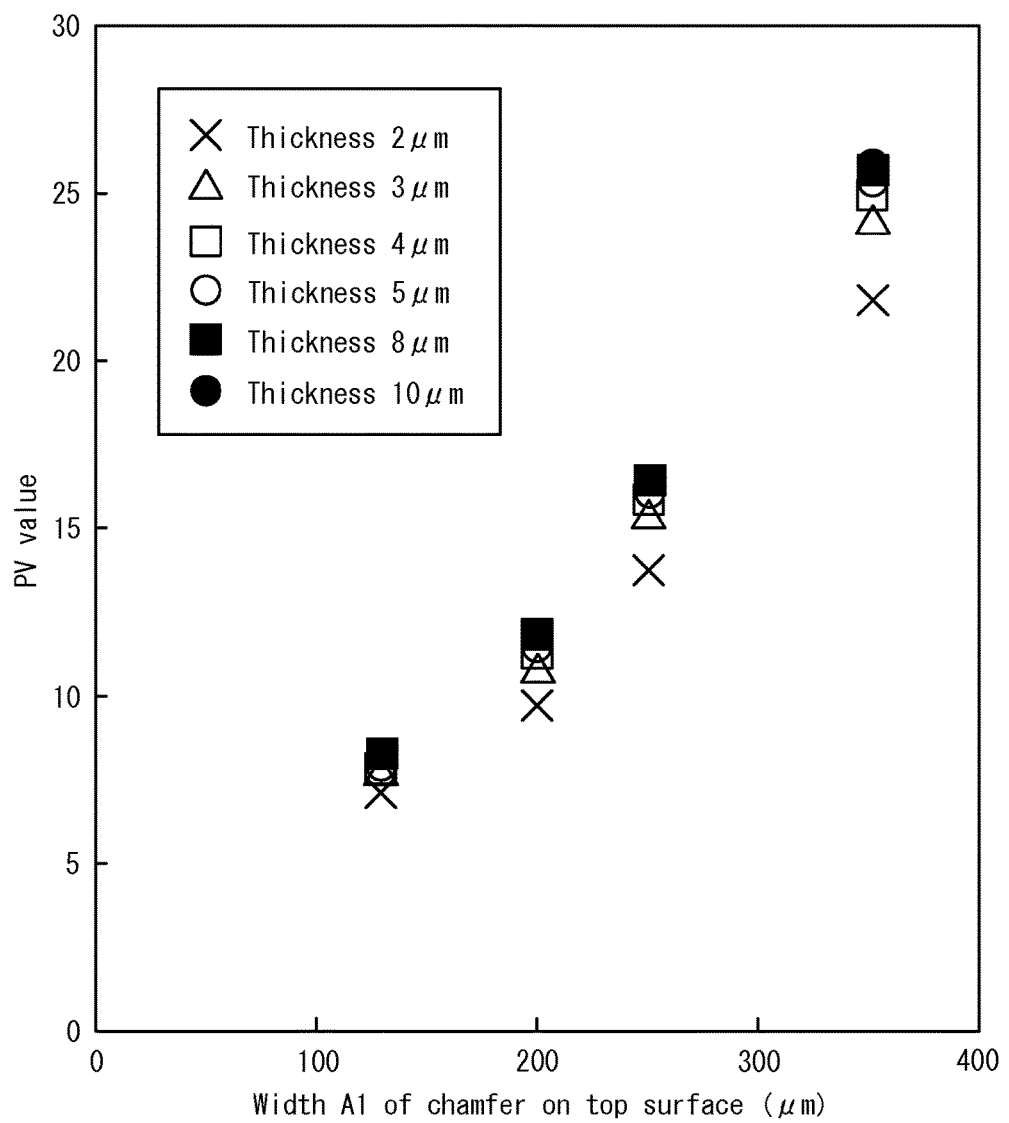
FIG. 7 is a graph showing the relationship between the width A1 of chamfer on the top surface of the silicon wafer and the PV value in Examples 1 to 12 and Comparative Examples 1 to 12.

FIG. 7 shows the relationship of the PV value with the width A1 of chamfer on the top surface side in Examples 1 to 12 and Comparative Examples 1 to 12.

Figure 8C:
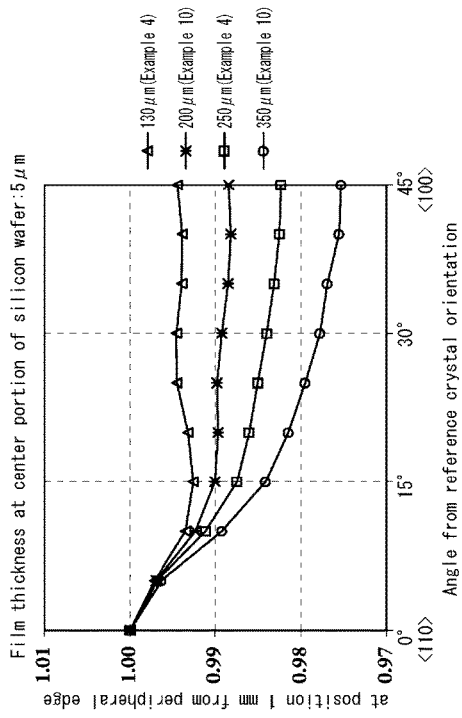
FIGS. 8(A) to 8(D) are graphs showing the relationship between the angle from the reference crystal orientation and the film thickness of an epitaxial layer in Examples 4 and 10 and Comparative Examples 4 and 10.
Figure 8D:
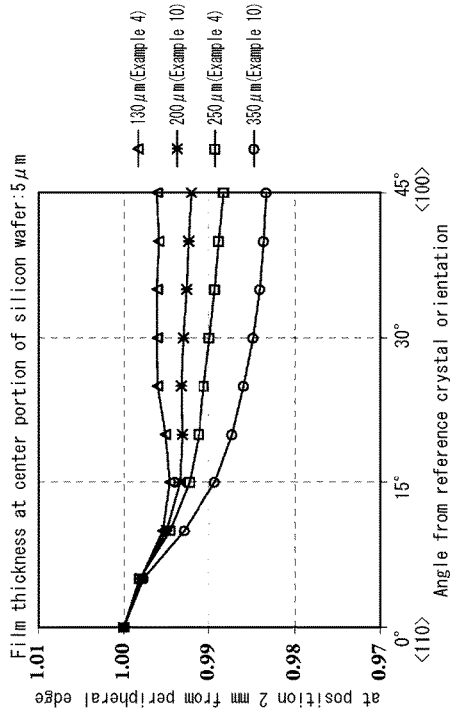
Figure 8A:
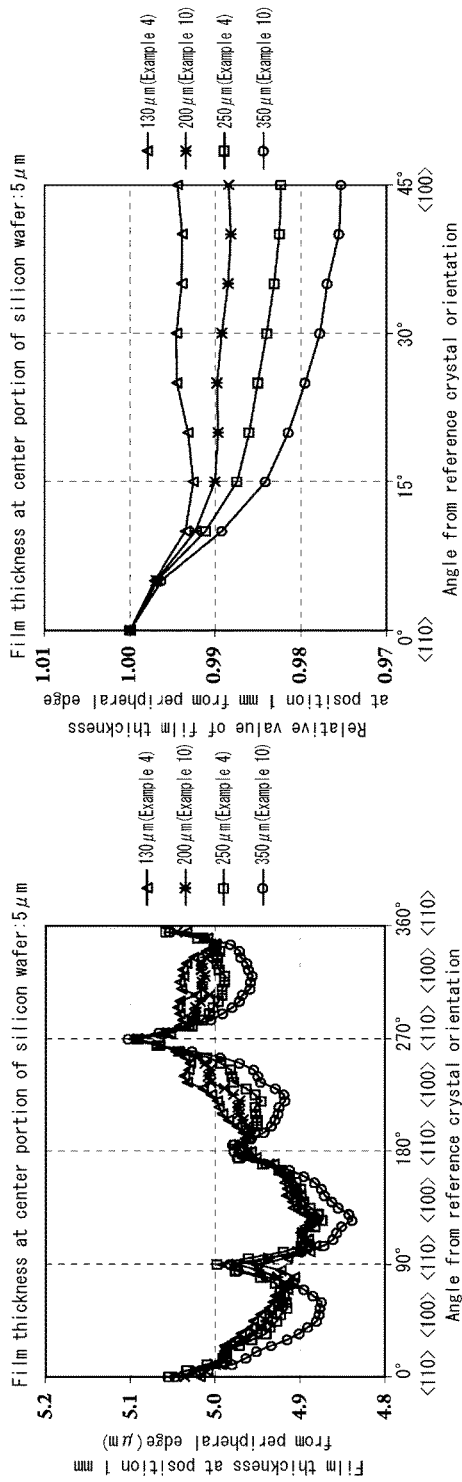
Figure 8B:
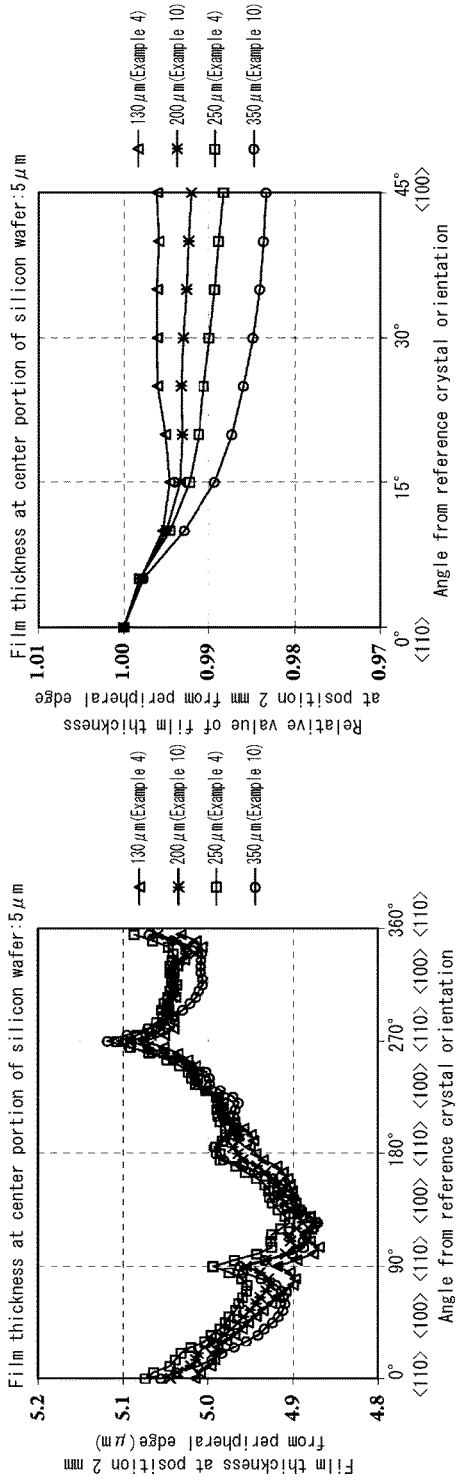

FIG. 8(A) and FIG. 8(B) each show a graph showing the result of measurement of the profile of the thickness in the circumferential direction of the epitaxial layer at positions 1 mm and 2 mm inside the peripheral edge of the epitaxial wafer in Examples 4 and 10 and Comparative Examples 4 and 10. FIG. 8(C) is a graph in which FIG. 8(A) is periodized by 45° using relative values with the film thickness at 0° being 1, and FIG. 8(D) is also a graph in which FIG. 8(B) is periodized by 45° using relative values.

FIG. 9(A) and FIG. 9(B) each show the result of measurement of ESFQR at positions 1 mm and 1.5 mm inside the peripheral edge of the epitaxial wafer in Examples 4 and 10 and Comparative Examples 4 and 10. FIG. 9(C) is a graph in which FIG. 9(A) is periodized by 45°. Similarly, FIG. 9(D) is a graph in which FIG. 9(B) is periodized by 45°.

FIGS. 4(A) and 4(B) and FIGS. 5(A) and 5(B) show that as the width A1 of chamfer on the top surface side is shorter, the variation in the flatness (ESFQR) is less varied. FIG. 6 also shows that as the length A1 is shorter, the growth rate orientation dependence can be suppressed and the variation in the film thickness in the circumferential direction of the epitaxial layer at the peripheral portion can be reduced.

Further, FIG. 7 and Table 1 show that when the width A1 of chamfer on the top surface 23 side of the silicon wafer 2 is 200 μm or less, the growth rate orientation dependence can be suppressed and the epitaxial silicon wafer 1 having high flatness at the peripheral portion with a PV value of 12.5 or less was therefore obtained, notwithstanding that the epitaxial layer formed had a thickness of 2 μm or more. Here, FIGS. 8(A) to 8(D) show that the film thickness in the circumferential direction of the epitaxial layer is less varied even at positions 1 mm and 2 mm from the peripheral edge of the epitaxial wafer. Further, FIGS. 9(A) to 9(D) show that the ESFQR in the circumferential direction is less varied even at positions 1 mm and 1.5 mm from the peripheral edge of the epitaxial wafer. Therefore, it can be concluded that the position where the growth rate orientation dependence appears did not shift to the peripheral side of the wafer, but the growth rate orientation dependence itself decreased.

INDUSTRIAL APPLICABILITY

The present invention can provide a method of producing an epitaxial silicon wafer having high flatness at the peripheral portion by suppressing the growth rate orientation dependence by reducing the width of chamfer on the end of the surface of a silicon wafer to be epitaxially grown, to 200 μm or less and then forming an epitaxial layer and can provide an epitaxial silicon wafer which can be obtained by the method.

REFERENCE SIGNS LIST

1: Epitaxial silicon wafer
11: Peripheral portion of epitaxial silicon wafer
2: Silicon wafer
21: Edge region
22: Bevel region
23: Top surface
24: Rear surface
3 Epitaxial layer
4: Silicon source gas
51: Sector
52: Edge exclusion zone

The invention claimed is:

1. A method of producing an epitaxial silicon wafer, wherein an epitaxial layer is formed on one surface of a silicon wafer with a chamfered end having a width of 200 μm or less, which surface has a surface orientation of the (100) plane or the (110) plane, wherein in the formation of the epitaxial layer, the PV value with respect to a surface of the epitaxial layer is controlled to 12.5 or less,
the PV value being defined as a value found by dividing a value (nm) obtained by subtracting the minimum value of the average value of the ESFQR per crystal orientation with the edge exclusion zone being set to 1 mm from the maximum value thereof, by the film thickness (μm) of the epitaxial layer at the center portion of the silicon wafer.

2. The method of producing an epitaxial silicon wafer according to claim 1, wherein the film thickness of the epitaxial layer at a center portion of the silicon wafer is 2 μm to 10 μm.

3. The method of producing an epitaxial silicon wafer according to claim 1, wherein the width of chamfer on the one surface side of the silicon wafer is 100 μm or more.

4. The method of producing an epitaxial silicon wafer according claim 1, wherein the width of chamfer on the other surface side of the silicon wafer is 300 μm to 400 μm.

5. An epitaxial silicon wafer, comprising:
a silicon wafer of which one surface has a surface orientation of the (100) plane or the (110) plane and has a chamfered end having a width of 200 μm or less; and
an epitaxial layer formed on the one surface of the silicon wafer,
wherein the PV value with respect to a surface of the epitaxial layer is 12.5 or less,
the PV value being defined as a value found by dividing a value (nm) obtained by subtracting the minimum value of the average value of the ESFQR per crystal orientation with the edge exclusion zone being set to 1 mm from the maximum value thereof, by the film thickness (μm) of the epitaxial layer at a center portion of the silicon wafer.

6. The epitaxial silicon wafer according to claim 5, wherein the film thickness of the epitaxial layer at a center portion of the silicon wafer is 2 μm to 10 μm.

7. The epitaxial silicon wafer according to claim 5, wherein the width of chamfer on the other surface side of the silicon wafer is 300 μm to 400 μm.

* * * * *